US011643272B2

(12) United States Patent
Abe et al.

(10) Patent No.: US 11,643,272 B2
(45) Date of Patent: May 9, 2023

(54) ARTICLE TRANSPORT VEHICLE

(71) Applicant: Daifuku Co., Ltd., Osaka (JP)

(72) Inventors: Takeshi Abe, Hinocho (JP); Ryoji Kishi, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 17/366,541

(22) Filed: Jul. 2, 2021

(65) Prior Publication Data

US 2022/0024690 A1    Jan. 27, 2022

(30) Foreign Application Priority Data

Jul. 22, 2020   (JP) .............................. JP2020-124947

(51) Int. Cl.
*B65G 1/04*   (2006.01)
(52) U.S. Cl.
CPC ......... *B65G 1/0457* (2013.01); *B65G 1/0492* (2013.01); *B65G 2201/0297* (2013.01)
(58) Field of Classification Search
CPC ..................... B65G 1/0457; B65G 2201/0297
See application file for complete search history.

(56) References Cited

U.S. PATENT DOCUMENTS

| 8,231,324 | B2 * | 7/2012 | Yoshida ............... B65G 1/0407 414/280 |
| 9,187,300 | B2 * | 11/2015 | Yoshioka ............. B65G 1/0407 |
| 9,245,782 | B2 | 1/2016 | Yoshioka et al. |
| 9,457,955 | B2 * | 10/2016 | Omori ............... H01L 21/67259 |

FOREIGN PATENT DOCUMENTS

| JP | 5700255 B2 | 2/2015 |
| JP | 2018049943 A * | 3/2018 ............. B65G 35/00 |
| JP | 6586936 B2 | 9/2019 |

* cited by examiner

*Primary Examiner* — Jonathan Snelting
(74) *Attorney, Agent, or Firm* — The Webb Law Firm

(57) ABSTRACT

In an article transport vehicle that is able to transport a plurality of types of articles, the efficiency of operations is improved in accordance with the type of article, while suppressing an increase in the size of the article transport vehicle. If a control device determines that an article held by a holding portion is a first-type article, the control device controls the transfer mechanism so as to cause the turning mechanism to perform a turning mechanism and cause a sliding mechanism to perform a sliding operation such that operation periods of these operations do not overlap. If the control device determines that the article held by the holding portion is a second-type article, the control device controls the transfer mechanism so as to perform the turning operation and the sliding operation such that the operation periods of these operations overlap.

6 Claims, 8 Drawing Sheets

Fig.9

| | DETECTION RESULT | OPERATION |
|---|---|---|
| PICK-UP | NONE | HOLDING-SLIDING OPEARTION → TURN |
| DELIVERY | FIRST-TYPE ARTICLE | TURNING → HOLDING-SLIDING OPERATION |
| | SECOND-TYPE ARTICLE | SIMULTANEOUSLY DRIVE |

Fig.10

| | INFORMATION ACQUIRED | OPERATION |
|---|---|---|
| PICK-UP | FIRST-TYPE ARTICLE | HOLDING-SLIDING OPEARTION → TURN |
| | SECOND-TYPE ARTICLE | SIMULTANEOUSLY DRIVE |
| DELIVERY | FIRST-TYPE ARTICLE | TURNING → HOLDING-SLIDING OPERATION |
| | SECOND-TYPE ARTICLE | SIMULTANEOUSLY DRIVE |

Fig.11

| | DETECDTION RESULT | INFORMATION ACQUIRED | OPERATION |
|---|---|---|---|
| DELIVERY | FIRST-TYPE ARTICLE | FIRST-TYPE ARTICLE | TURN → HOLDING-SLIDING OPERATION |
| | FIRST-TYPE ARTICLE | SECOND-TYPE ARTICLE | TURN → HOLDING-SLIDING OPERATION |
| | SECOND-TYPE ARTICLE | FIRST-TYPE ARTICLE | TURN → HOLDING-SLIDING OPERATION |
| | SECOND-TYPE ARTICLE | SECOND-TYPE ARTICLE | SIMULTANEOUSLY DRIVE |

ARTICLE TRANSPORT VEHICLE

CROSS-REFERENCE TO RELATED APPLICATION

This application claims priority to Japanese Patent Application No. 2020-124947 filed Jul. 22, 2020, the disclosures of which are hereby incorporated by reference in their entirety.

BACKGROUND OF THE INVENTION

1. Field of the Invention

The present invention relates to an article transport vehicle that moves along a moving path and transports a plurality of types of articles.

2. Description of Related Art

For example, JP 5700255B (Patent Document 1) discloses a plurality of types of article transport vehicles corresponding to respective types of articles. Patent Document 1 discloses article transport vehicles, namely a first ceiling transport vehicle (B1) dedicated to transporting wafer storage containers (W) and a second ceiling transport vehicle (B2) dedicated to transporting reticle storage containers (R). Since the wafer storage containers (W) and the reticle storage containers (R) have different sizes and shapes, different types of article transport vehicles are used as mentioned above in the technology disclosed in Patent Document 1. Note that the reference signs shown above in parentheses are those used in Patent Document 1.

Meanwhile, for example, JP 6586936B (Patent Document 2) discloses an article transport vehicle that changes the orientation of each article during transport. An article transport vehicle (2) disclosed in Patent Document 2 is configured to cause a gripping portion (3Ga) for gripping an article (W) to protrude outward of a containing portion (22a) by sliding the gripping portion (3Ga) in a lateral direction (Y) and arranging the gripping portion (3Ga) directly above a delivery/reception portion (6b) of a transferring area (6), and thereafter transfer the article (W) to and from the delivery/reception area (6b) by raising and lowering the gripping portion (3Ga). In the technology disclosed in Patent Document 2, the orientation of each article (W) is changed such that the article (W) is in an appropriate orientation required at a transport destination by being turned about a vertical axis while the article (W) is transported from a transport source to the transport destination. Note that the reference signs shown above in parentheses are those used in Patent Document 2.

In a configuration where a plurality of types of articles can be transported by one article transport vehicle, the article transport vehicle for transporting each type of article can be more flexibly selected than in the case of using a plurality of types of article transport vehicles corresponding to respective types of articles as in the technology disclosed in Patent Document 1. As a result, the entire facility can be efficiently operated.

In the technology disclosed in Patent Document 2, each article is turned in a state of being located outside the containing portion after being slid in the lateral direction. However, if the sliding operation and the turning operation can be performed in parallel, it is possible to shorten the time required for the operation of changing the orientation of the article and improve the efficiency of the operations. However, in order to be able to transport a plurality of types of articles with different sizes while also being able to perform the turning operation during the sliding operation, it is necessary to design the size of the article transport vehicle, especially the size of the space around the containing portion, so as to match an article with the largest turning radius. In this case, there is a problem in that the size of the article transport vehicle is likely to increase.

In view of the foregoing circumstances, there is demand for realization of a technology with which, in an article transport vehicle that is able to transport a plurality of types of articles, the efficiency of operations can be improved in accordance with the type of article while suppressing an increase in the size of the article transport vehicle.

SUMMARY OF THE INVENTION

An article transport vehicle that moves along a moving path and transports a plurality of types of articles, assuming that a direction in which the article is transported along the moving path is a transport direction, and a direction intersecting the transport direction when viewed in a vertical direction is an intersecting direction, the article transport vehicle includes:

a containing portion configured to contain an article, of the plurality of types of articles;

a transfer mechanism configured to perform a transfer operation of transferring the article to and from a transferring area located outside the containing portion; and a control device configured to control the transfer mechanism, wherein, the transfer mechanism includes: a holding portion configured to hold the article; a lifting mechanism configured to raise and lower the holding portion; a sliding mechanism configured to slide the holding portion along the intersecting direction between inside and outside the containing portion; and a turning mechanism configured to turn the holding portion about a vertical axis, the plurality of types of articles include at least two types, namely, a first-type article and a second-type article, assuming that a movement trajectory of the first-type article when slid by the sliding mechanism without being turned by the turning mechanism is a first sliding trajectory, a movement trajectory of the first-type article when slid by the sliding mechanism while being turned by the turning mechanism is a first turning movement trajectory, a movement trajectory of the second-type article when slid by the sliding mechanism without being turned by the turning mechanism is a second sliding trajectory, and a movement trajectory of the second-type article when slid by the sliding mechanism while being turned by the turning mechanism is a second turning movement trajectory, the first-type article is an article whose first sliding trajectory does not overlap with a target member provided in the containing portion, and whose first turning movement trajectory overlaps with the target member, and the second-type article is an article whose second sliding trajectory and second turning movement trajectory do not overlap with the target member provided in the containing portion, and the control device controls the transfer mechanism so as to cause the turning mechanism to perform a turning operation and cause the sliding mechanism to perform a sliding operation such that an operation period of the turning operation and an operation period of the sliding operation do not overlap, if the control device determines that the article held by the holding portion is the first-type article, and controls the transfer mechanism so as to perform the turning operation and the sliding operation such that the operation period of the turning operation and the operation period of the sliding operation overlap, if the control device determines that the article held by the holding portion is the second-type article.

According to this configuration, the first turning movement trajectory of the first-type article overlaps with the target member provided in the containing portion. For this reason, if the turning operation and the sliding operation are performed such that the operation periods of these operations overlap when the article held by the holding portion is the first-type article, it is possible that the first-type article will interfere with the target member. However, according to this configuration, if the control device determines that the article held by the holding portion is the first-type article, the control device controls the transfer mechanism so as to perform the turning operation and the sliding operation such that the operation periods thereof overlap. Since the first sliding trajectory of the first-type article does not overlap with the target member, it is possible to perform the sliding operation without causing the first-type article to interfere with the target member, and to turn the first-type article at a position at which the first-type article does not interfere with the target member. It is therefore possible to avoid interference between the first-type article and the target article. On the other hand, the second turning movement trajectory of the second-type article does not overlap with the target member provided in the containing portion. According to this configuration, if the article held by the holding portion is the second-type article, the turning operation and the sliding operation are performed such that the operation periods of these operations overlap. Thus, the sliding operation and the turning operation can be performed in parallel, and it is therefore possible to shorten the time required for the operation of changing the orientation of the article, and improve the efficiency of the operations.

Further, according to this configuration, it is possible to design the size of the article transport vehicle, particularly the size of the space around the containing portion, so as to match the second-type article whose turning radius is smaller than that of the first-type article. Accordingly, there is also an advantage that the size of the article transport vehicle can be easily reduced compared with the case of designing the article transport vehicle and the containing portion thereof so as to match the first-type article.

As described above, according to this configuration, in an article transport vehicle that is able to transport a plurality of types of articles, the efficiency of the operations can be improved in accordance with the type of article, while suppressing the increase in the size of the article transport vehicle.

Further features and advantages of the technology according to the present disclosure will become more apparent in the description of the following exemplary and non-limiting embodiment that will be described with reference to the drawings.

BRIEF DESCRIPTION OF THE DRAWINGS

FIG. 9 is a diagram showing operations of a transfer mechanism that are based on detection results of detection by an article type detection unit.
FIG. 10 is a diagram showing operations of the transfer mechanism that are based on article type information acquired by an instruction acquisition unit in another embodiment.
FIG. 11 is a diagram showing operations of the transfer mechanism that are based on the results of detection by the article type detection unit and the article type information acquired by the instruction acquisition unit in another embodiment.

DETAILED DESCRIPTION OF PREFERRED EMBODIMENTS

An embodiment of an article transport vehicle will be described with reference to the drawings. In the following, an article transport vehicle according to the present embodiment will be described while taking, as an example, the case where the article transport vehicle is applied to an article transport facility in which articles are transported.

Figure 1:
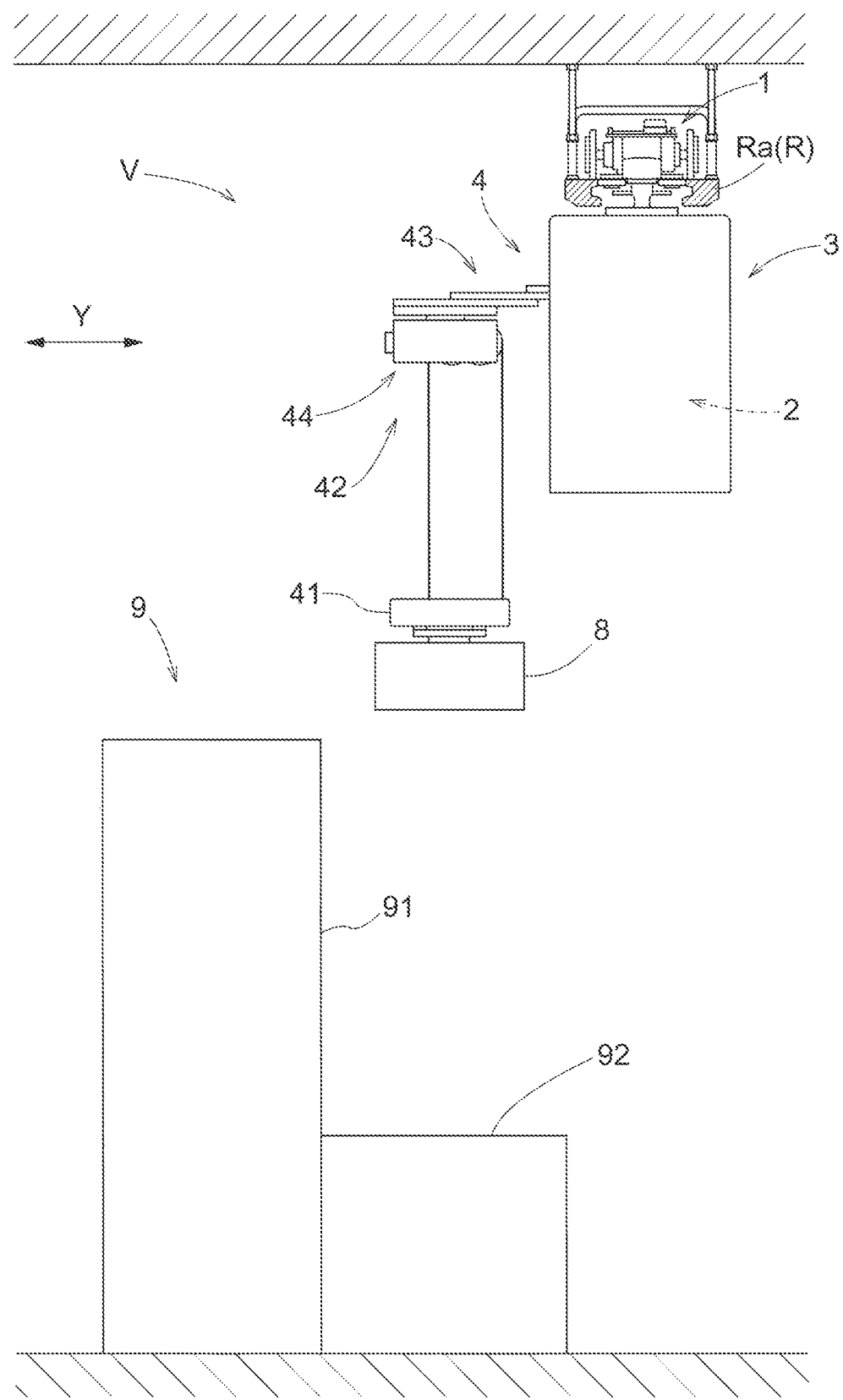
FIG. 1 is a front view of an article transport facility.
Figure 2:
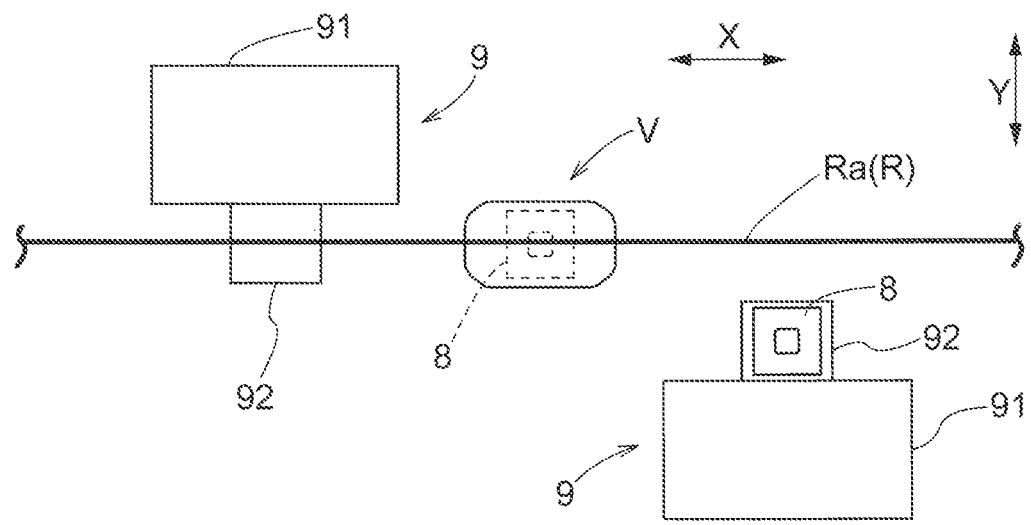
FIG. 2 is a plan view of the article transport facility.

As shown in FIGS. 1 and 2, the article transport facility includes an article transport vehicle V that transports an article 8, a rail Ra that is installed near the ceiling of the facility and constitutes a moving path R of the article transport vehicle V, and a transferring area 9 in which the article 8 is transferred to and from the article transport vehicle V.

A processing device 91 that performs processing on the article 8 and a support platform 92 that is arranged adjacent to the processing device 91 and supports the article 8 are provided in the transferring area 9. In the present embodiment, the article transport vehicle V transports an article 8 that has not yet been subjected to the processing by the processing device 91 from a transport source (not shown) to the support platform 92, and transports an article 8 that has been subjected to the processing by the processing device 91 from the support platform 92 to a transport destination (not shown). In the present embodiment, each article 8 is a container for storing an object to be processed, i.e., an object to be subjected to the processing by the processing device 91, and the aforementioned "processing on the article 8" means processing for the object to be processed that is contained in the article 8. For example, the article 8 may be a wafer storage container for storing a wafer (a so-called FOUP: Front Opening Unified Pod), or may be a reticle storage container for storing a reticle (a so-called reticle pod). If the article 8 is an FOUP, the object to be processed is a wafer. If the article 8 is a reticle pod, the object to be processed is a reticle.

A configuration of the article transport vehicle V will be described below in detail with reference to FIGS. 1 to 3. Note that, in the following, the direction in which the article transport vehicle V transports the article 8 along the moving path R is referred to as a "transport direction X". The direction that intersects the transport direction X when viewed in the vertical direction is referred to as an "intersecting direction Y". In this example, the intersecting direction Y is a direction orthogonal to the transport direction X when viewed in the vertical direction. Note that the transport direction X and the intersecting direction Y may be paraphrased as a first direction and a second direction, respectively. The first direction and the second direction are directions that intersect each other when viewed in the vertical direction.

The article transport vehicle V moves along the moving path R and transports a plurality of types of articles 8. The article transport vehicle V includes a containing portion 2 for containing an article 8, a transfer mechanism 4 for performing an operation of transferring the article 8 to and from the transferring area 9, which is located outside the containing portion 2, and a subordinate control device Cv (see FIG. 5) for controlling the transfer mechanism 4. In the present embodiment, the article transport vehicle V also includes a traveling mechanism 1 and a cover 3 for covering the containing portion 2. Note that in the present embodiment, the subordinate control device Cv corresponds to a "control device".

The traveling mechanism 1 includes traveling wheels 10 that roll on the rail Ra, and a traveling motor M1 (see FIG. 5) for driving the traveling wheels 10. In the example shown in the diagrams, a plurality of traveling wheels 10 are provided on the article transport vehicle V. The traveling motor M1 drives at least one of the plurality of traveling wheels 10 and apply the propelling force for the article transport vehicle V to travel in the transport direction X.

The cover 3 is supported in a suspended manner by the traveling mechanism 1. The traveling mechanism 1 is arranged above the rail Ra, and the cover 3 is arranged below the rail Ra. In the present embodiment, the cover 3 covers the upper side and the two sides in the transport direction X of the containing portion 2. In this example, the cover 3 includes an upper cover portion 30 that covers the upper side of the containing portion 2, a first cover portion 31 that covers one side in the transport direction X of the containing portion 2, and a second cover portion 32 that covers the other side in the transport direction X of the containing portion 2. The first cover portion 31 and the second cover portion 32 are arranged so as to oppose faces of an article 8 contained in the containing portion 2 that face in the transport direction X. The cover 3 is not arranged on the two sides in the intersecting direction Y of the containing portion 2, and these two sides are open.

The transfer mechanism 4 includes a holding portion 41 for holding an article 8, a lifting mechanism 42 for raising and lowering the holding portion 41, a sliding mechanism 43 for sliding the holding portion 41 in the intersecting direction Y between inside and outside the containing portion 2, and a turning mechanism 44 for turning the holding portion 41 about a vertical axis.

The holding portion 41 includes a pair of gripping claws 411 and a gripping motor M41 (see FIG. 5) for moving the two gripping claws 411 toward and away from each other. The holding portion 41 is configured to be switched between a gripping state in which the pair of gripping claws 411 grip an article 8 and a grip-canceling state in which the gripping state is canceled, by driving the gripping motor M41 to move the two gripping claws 411 toward or away from each other. In the present embodiment, each article 8 includes an article body 8b and a held portion 8g provided above the article body 8b. The holding portion 41 is configured to hold the article 8 by holding the held portion 8g of the article 8; more specifically by gripping the held portion 8g using the pair of gripping claws 411.

The sliding mechanism 43 has a sliding body 431 that moves in the intersecting direction Y relative to the containing portion 2, and a sliding motor M43 (see FIG. 5) for moving the sliding body 431 in the intersecting direction Y. The sliding mechanism 43 is configured to move, i.e., slide the lifting mechanism 42, the holding portion 41, and the article 8 held by the holding portion 41 in the intersecting direction Y by driving the sliding motor M43 to move the sliding body 431 in the intersecting direction Y. If the support platform 92 in the transferring area 9 is arranged at a position shifted in the intersecting direction Y relative to the moving path R as shown in FIG. 1, the sliding mechanism 43 can arrange the article 8 at a position overlapping with the support platform 92 when viewed in the vertical direction by sliding the article 8 held by the holding portion 41 in the intersecting direction Y. Thus, the article 8 can be appropriately transferred onto the support platform 92 by the lifting mechanism 42.

The turning mechanism 44 has a turning body 441 that is supported so as to be able to turn about a vertical axis relative to the sliding body 431, and a turning motor M44 (see FIG. 5) for turning the turning body 441 about the vertical axis. The turning mechanism 44 is configured to turn the holding portion 41 and the article 8 held by the holding portion 41 about the vertical axis by driving the turning motor M44 to turn the turning body 441. The orientation of the article 8 held by the holding portion 41 can be changed such that the article 8 faces in an appropriate direction relative to the transferring area 9 by turning the article 8. For example, if the article 8 is a FOUP, an opening portion for putting an object to be processed in and out of the article 8 is provided in a front face thereof. In this case, the orientation of the article 8 is changed by the turning mechanism 44 such that the opening portion opposes the processing device 91. Thus, the article 8 can be mounted on the support platform 92 in an appropriate direction relative to the processing device 91.

The lifting mechanism 42 is configured to raise and lower the holding portion 41 between a height corresponding to the containing portion 2 and a height corresponding to the support platform 92 (transferring area 9). The lifting mechanism 42 includes a pulley 421 that is supported by the turning body 441, a belt 422 that is wound around the pulley 421 and has a leading end portion to which the holding portion 41 is coupled, and a lifting motor M42 (see FIG. 5) for rotating the pulley 421 and driving the belt 422. The lifting mechanism 42 raises the holding portion 41 and the article 8 held by the holding portion 41 by driving the lifting motor M42 to rotate the pulley 421 in a forward direction and winding the belt 422. The lifting mechanism 42 lowers the holding portion 41 and the article 8 held by the holding portion 41 by driving the lifting motor M42 to rotate the pulley 421 in a backward direction and unwinding the belt 422. The article 8 can be transferred to and from the support platform 92 (transferring area 9) arranged below the containing portion 2 as a result of the lifting mechanism 42 raising and lowering the article 8 held by the holding portion 41.

Figure 4:
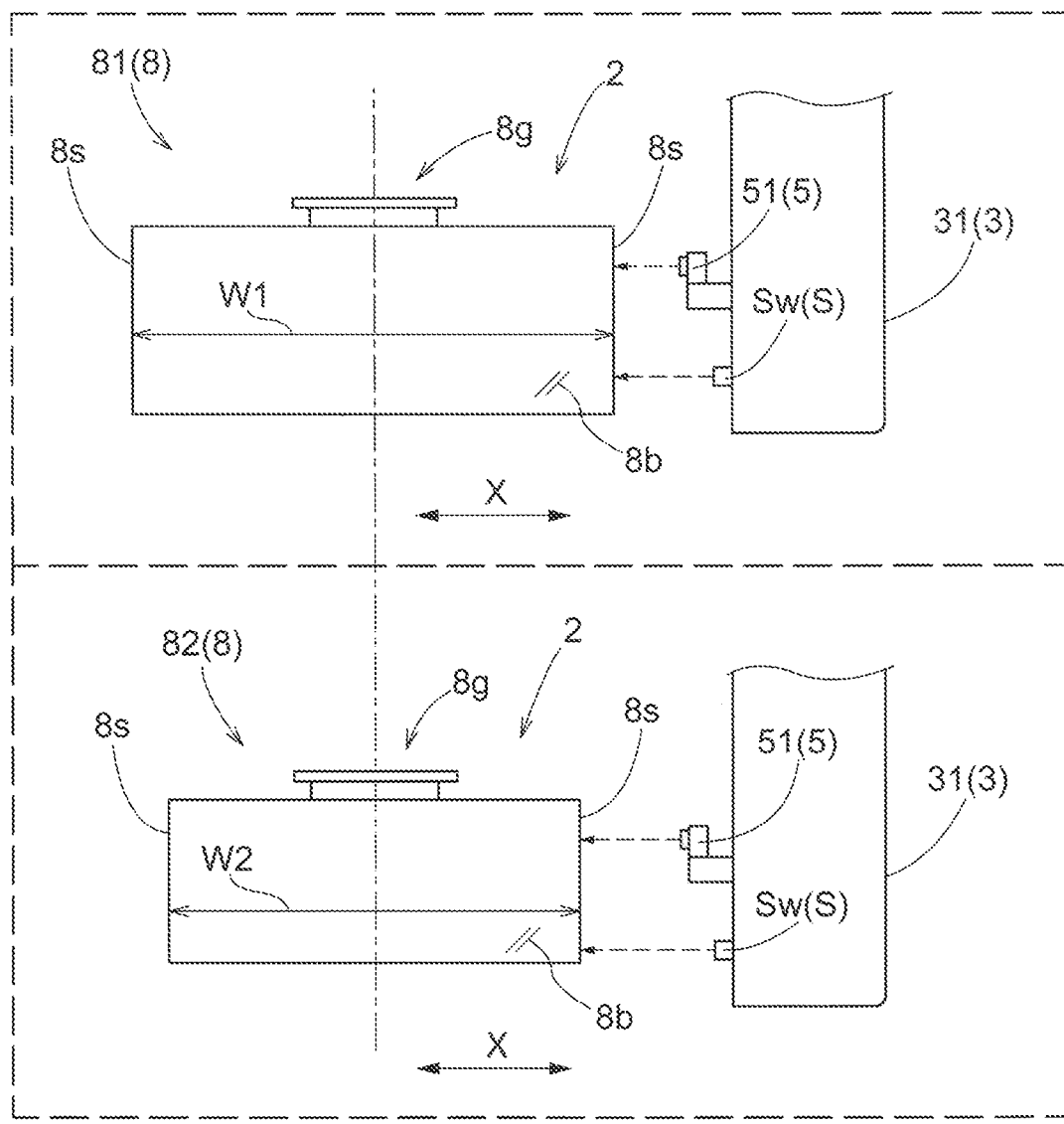
FIG. 4 is a diagram illustrating detection of the type of an article.

Here, there are at least two types of articles 8 to be transported by the article transport vehicle V, namely a first-type article 81 and a second-type article 82, as shown in FIG. 4. In the following, the first-type article 81 and the second-type article 82 are collectively referred to as "articles 8" when these articles are not specifically distinguished.

As mentioned above, each article 8 includes the article body 8b and the held portion 8g. In the present embodiment, assuming that the length in the horizontal direction of the article body 8b is an article width, the first-type article 81 has a first width W1, and the second-type article 82 has a second width W2, which is smaller than the first width W1. In the present specification, the "article width" is defined by the length in the transport direction X of the article body 8b when the article 8 is in a transport orientation when contained in the containing portion 2 and transported by the traveling mechanism 1. That is to say, the distance between a side surface 8s of the article body 8b that faces toward one side in the transport direction X and a side surface 8s that faces toward the other side in the transport direction X is regarded as the article width. The following description will be given while assuming that the "side surfaces 8s of the article body 8b" and the "side surfaces 8s of the article 8" have the same meaning, as necessary.

Figure 7:
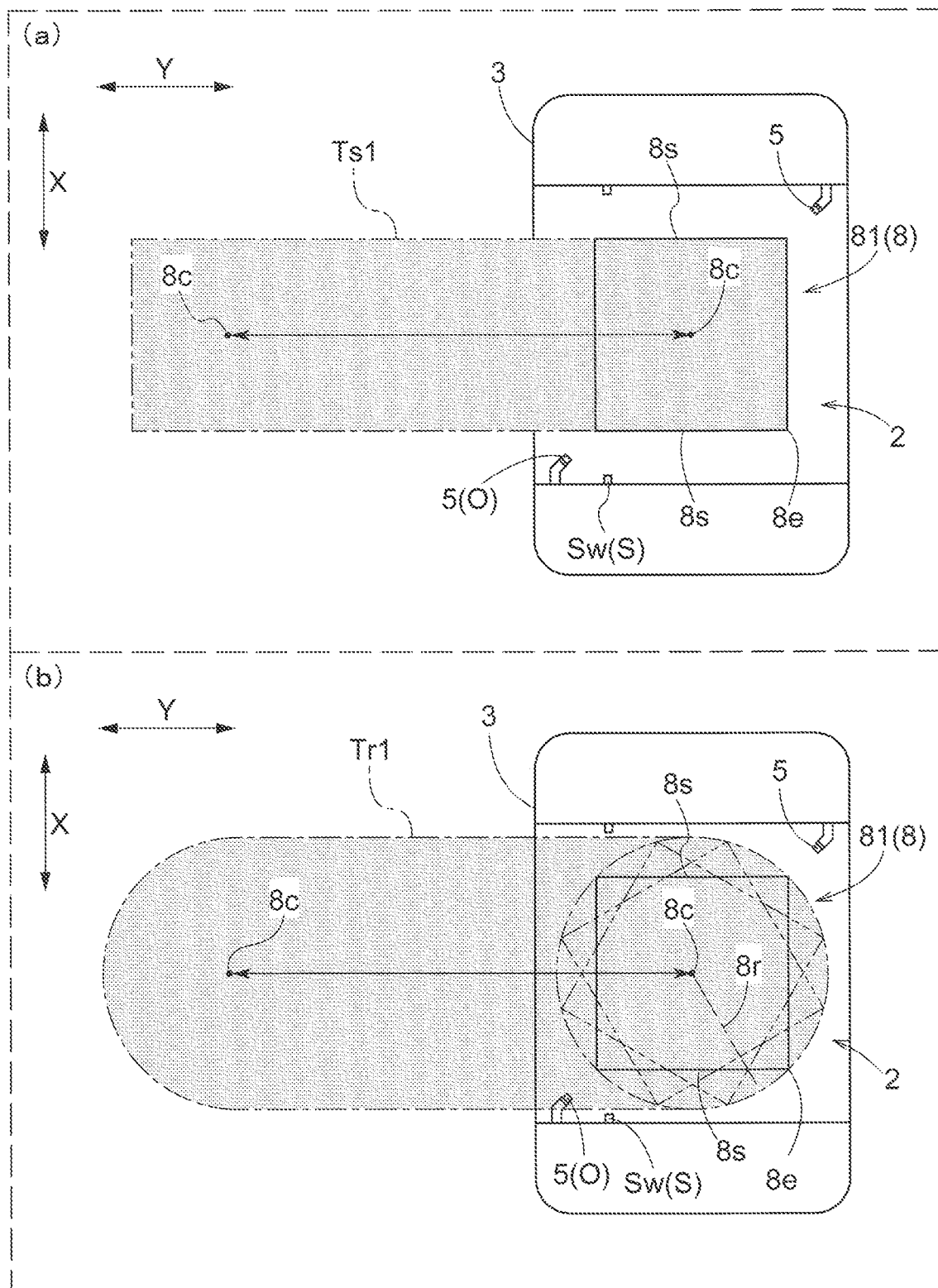
FIG. 7 is a diagram illustrating a first sliding trajectory and a first turning movement trajectory of a first-type article.
Figure 8:
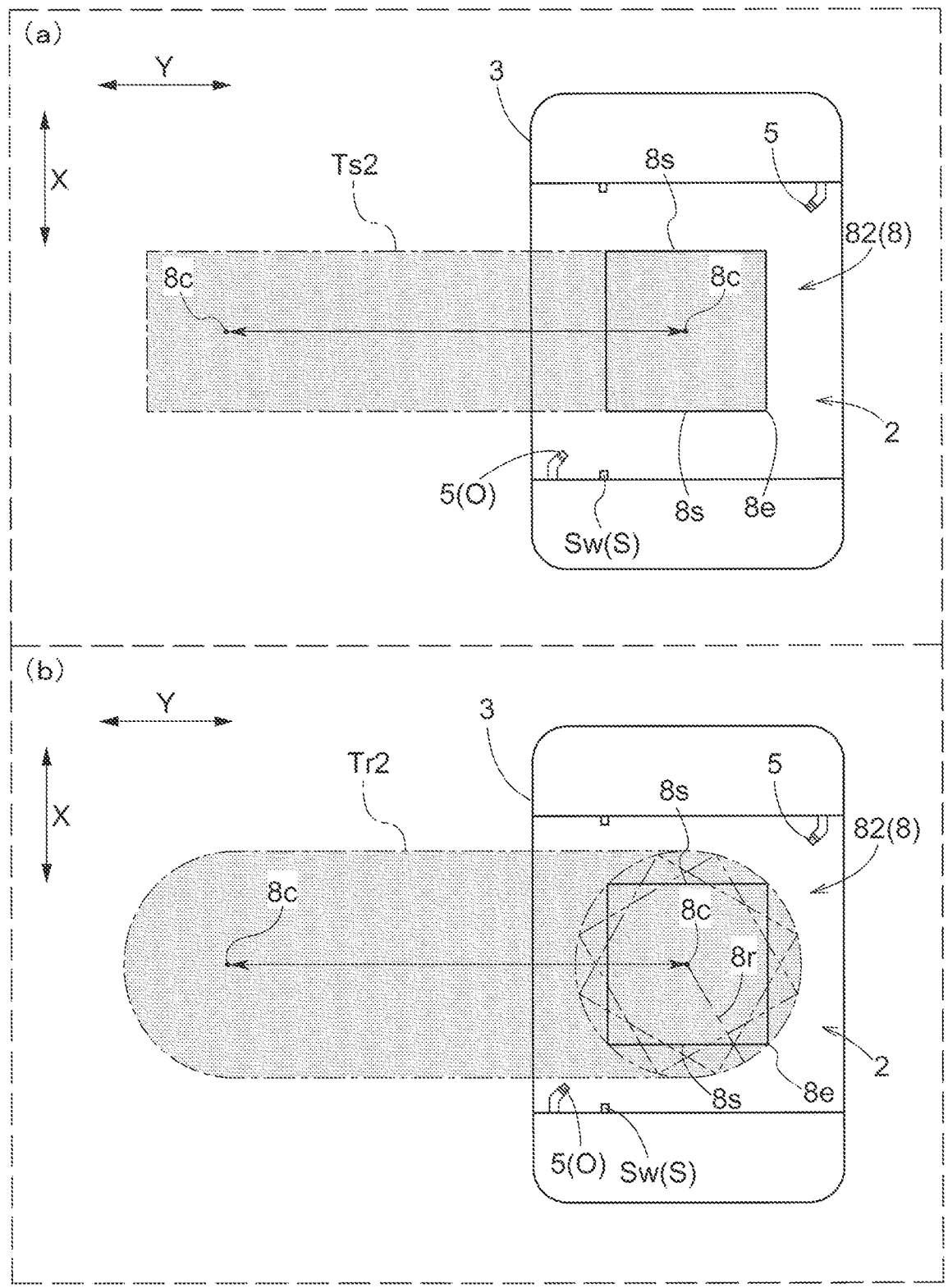
FIG. 8 is a diagram illustrating a second sliding trajectory and a second turning movement trajectory of a second-type article.

The article 8 is formed to have a polygonal shape or an elliptical shape in a plan view. In the present embodiment, the article 8 is formed to have a rectangular shape, or more specifically, a square shape in a plan view, as shown in FIGS. 7 and 8. In this example, both the first-type article 81 and the second-type article 82 are formed to have a rectangular shape, or more specifically, a square shape in a plan view. Although the first-type article 81 and the second-type article 82 in the present embodiment have similar shapes in a plan view, the first-type article 81 and the second-type article 82 may alternatively be formed to have shapes that are not similar.

Assuming that the center when each article 8 is turned is a turning center 8c, and a portion of the article 8 that is farthest from the turning center 8c in a plan view is a side end portion 8e, the distance from the turning center 8c to the side end portion 8e is greater in the first-type article 81 than in the second-type article 82, as shown in FIGS. 7 and 8. That is to say, assuming that the distance from the turning center 8c to the side end portion 8e is a turning radius 8r when each article 8 is turned, the turning radius 8r of the first-type article 81 is greater than the turning radius 8r of the second-type article 82.

Figure 3:
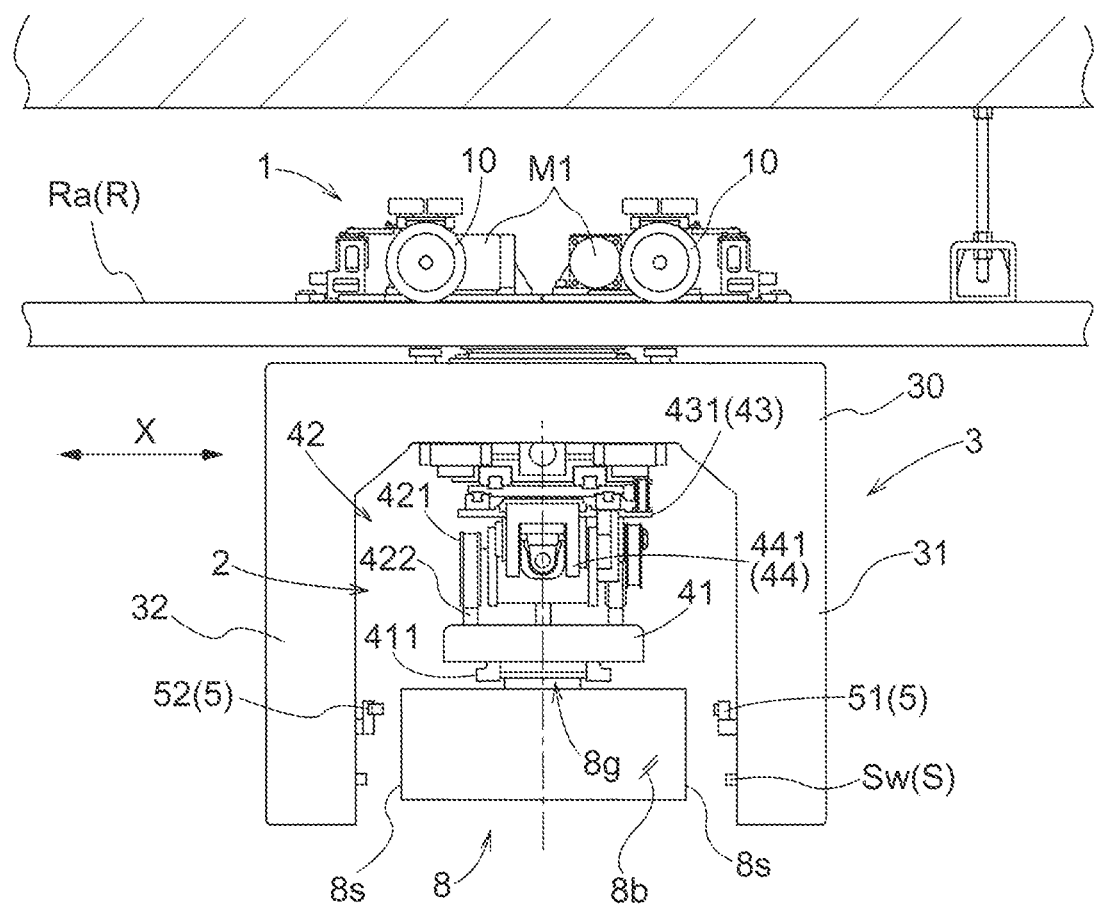
FIG. 3 is a side view of an article transport vehicle.

As shown in FIG. 3, the article transport vehicle V according to the present embodiment includes a load sensor 5 for detecting whether or not an article 8 contained in the containing portion 2 (which may also be hereinafter referred to as a "contained article 8") is present, and an article type detection unit S for detecting the type of the article 8 held by the holding portion 41.

The load sensor 5 detects whether or not an article 8 contained in the containing portion 2 is present, regardless of the type of the article 8. In the present embodiment, the load sensor 5 is constituted by an optical sensor, and projects a light beam such that the light beam crosses an arrangement region for an article 8 in the case where the article 8 is arranged in the containing portion 2. As mentioned above, articles 8 to be transported by the article transport vehicle V include a plurality of types of articles 8 with different sizes and shapes. The light beam projected by the load sensor 5 crosses the arrangement region that is common to all of the plurality of types of articles 8. Specifically, the loading sensor 5 is configured to project a light beam toward an area around the held portion 8g held by the holding portion 41 in a state where the article 8 is held by the holding portion 41 in the containing portion 2. The held portion 8g is an essential portion for each article 8 to be held by the holding portion 41, regardless of the type of the article 8. Accordingly, since the load sensor 5 is configured to project a light beam toward the area around the held portion 8g of each article 8, it can be appropriately detected whether or not an article 8 held by the holding portion 41 is present, regardless of the type of the article 8.

The load sensor 5 is provided such that at least a portion thereof protrudes into the containing portion 2. In other words, the load sensor 5 is provided such that at least a portion thereof is accommodated in the space covered by the cover 3. In the present embodiment, the load sensor 5 is attached to the cover 3 and arranged in the containing portion 2. In the example shown in the diagrams, the load sensor 5 includes a light projection unit 51 for projecting a light beam, and a light receiving unit 52 for receiving the light beam projected by the light projection unit 51, and both the light projection unit 51 and the light receiving unit 52 protrude into the containing portion 2. In the present embodiment, the light projection unit 51 is attached to one of the first cover portion 31 and the second cover portion 32 of the cover 3, and the light receiving unit 52 is attached to the other one of the first cover portion 31 and the second cover portion 32 of the cover 3. In the example shown in the diagram, the light projection unit 51 is attached to the first cover portion 31, and the light receiving unit 52 is attached to the second cover portion 32.

The article type detection unit S detects the type of the article 8 held by the holding portion 41. In other words, the article type detection unit S detects whether the article 8 held by the holding portion 41 is the first-type article 81 or the second-type article 82, or another type of article 8 (e.g., Nth-type article).

In the present embodiment, the article type detection unit S is configured to detect the type of the article 8 in a state of being contained in the containing portion 2. That is to say, the article type detection unit S is configured to detect the type of the article 8 in a state of being held by the holding portion 41 within the containing portion 2. In this example, the article type detection unit S includes a side surface position detection sensor Sw for detecting the position of a side surface 8s of the article 8 contained in the containing portion 2, and detects the type of contained article 8 based on the result of detection by the side surface position detection sensor Sw.

In the present embodiment, the side surface position detection sensor Sw detects the article width of the contained article 8 by detecting the position of a side surface 8s of the contained article 8. The side surface position detection sensor Sw is attached to the cover 3 and arranged in the containing portion 2. In this example, the side surface position detection sensor Sw is attached to the first cover portion 31 or the second cover portion 32 of the cover 3. The side surface position detection sensor Sw is configured as a distance sensor and detects the distance to a side surface 8s of the article 8 arranged in the containing portion 2. Here, the holding portion 41 is arranged in the containing portion 2, and the center position in the horizontal direction of the article 8 in a state of being held by the holding portion 41 (the position indicated by a dash-dot line passing through the held portion 8g in FIG. 4) corresponds to the position of the holding portion 41 and is therefore known. The side surface position detection sensor Sw detects the article width of the contained article 8 based on the distance from the side surface position detection sensor Sw to a side surface 8s of the contained article 8 and the center position in the horizontal direction of the contained article 8. It is then possible to detect whether the contained article 8 is the first-type article 81 with an article width that is the first width W1 or the second-type article 82 with an article width that is the second width W2, based on the article width of the contained article 8 detected by the side surface position detection sensor Sw. Note that the side surface position detection sensor Sw can also detect the article width of a contained articles 8 other than the first-type article 81 and the second-type article 82. Note that the distance sensor that constitutes the side surface position detection sensor Sw may be, for example, any of known sensors, such as a laser sensor, an optical sensor, and an ultrasonic sensor.

Figure 5:
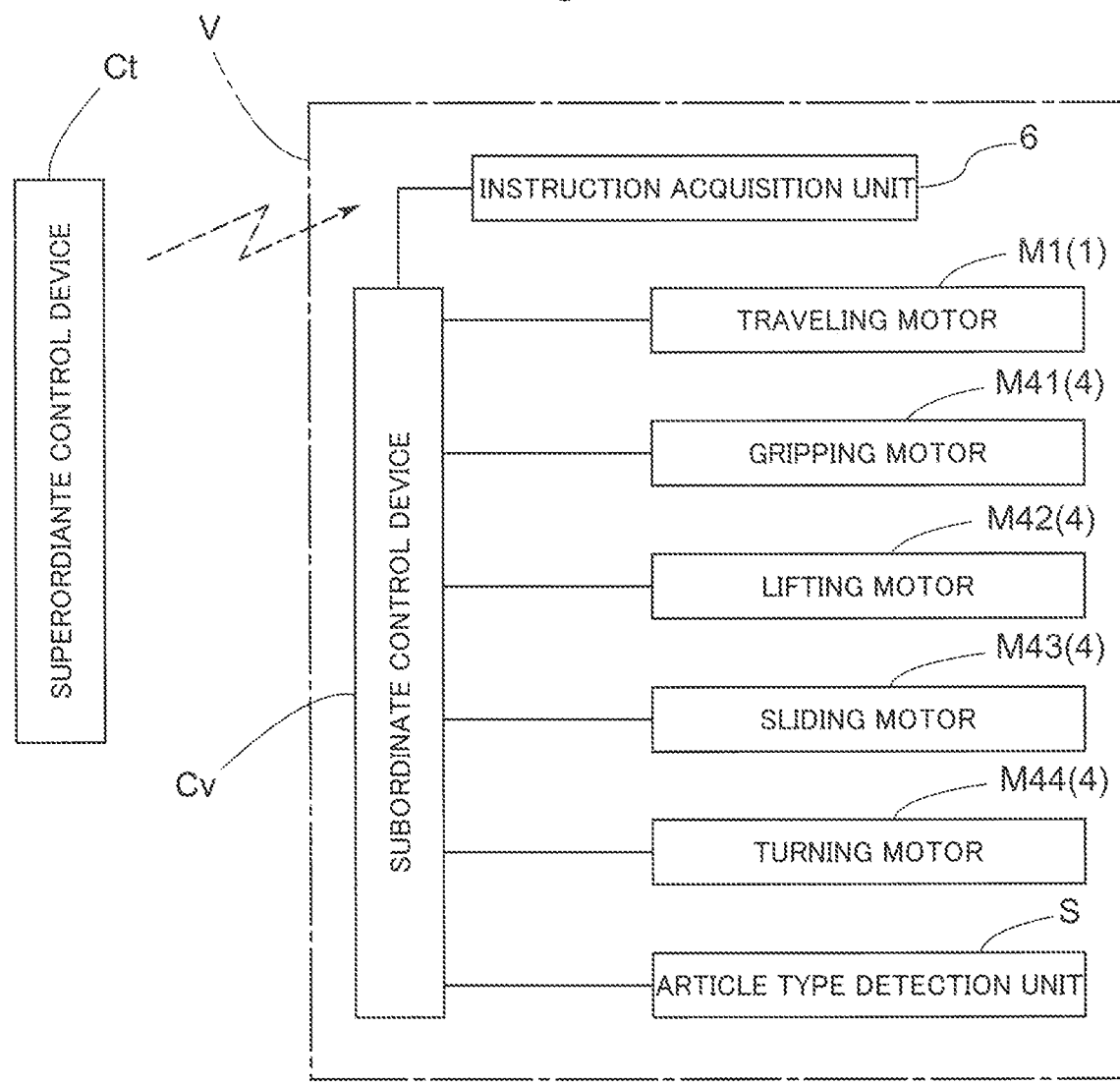
FIG. 5 is a control block diagram of the article transport facility.

Next, a control configuration of the article transport vehicle V will be described with reference to FIG. 5. Note that FIG. 5 is a control block diagram of the article transport facility equipped with the article transport vehicle V.

In the present embodiment, the article transport facility includes a superordinate control device Ct for managing the entire facility, and the article transport vehicle V has a subordinate control device Cv for managing each part of the article transport vehicle V. As mentioned above, in the present embodiment, the subordinate control device Cv corresponds to a "control device". The superordinate control device Ct and the subordinate control device Cv are configured to be able to communicate with each other. The superordinate control device Ct and the subordinate control device Cv each include a processor such as a microcomputer, a peripheral circuit such as a memory, and so on, for example. Each function is realized by cooperation of these pieces of hardware and programs executed on the processors such as computers.

The superordinate control device Ct transmits a transport instruction, i.e., an instruction to transport an article 8 to the subordinate control device Cv. In the present embodiment, the article transport vehicle V includes an instruction acquisition unit 6 for acquiring the instruction to transport an article 8 from the superordinate control device Ct. The instruction acquisition unit 6 that has acquired the transport instruction from the superordinate control device Ct transmits the acquired transport instruction to the subordinate control device Cv, and the subordinate control device Cv controls the article transport vehicle V and transports the article 8 in accordance with the transport instruction. The transport instruction acquired by the instruction acquisition unit 6 includes transport source information that indicates a transport source of the article 8 associated with the transport instruction, and transport destination information that indicates a transport destination thereof. That is to say, in this example, the superordinate control device Ct designates the transport source and the transport destination, and transmits a transport instruction to transport the first-type article 81, the second-type article 82, or another type of article 8, to the subordinate control device Cv via the instruction acquisition unit 6.

The subordinate control device Cv that has received the transport instruction controls the traveling mechanism 1 and the transfer mechanism 4 and transports and transfers the article 8 associated with the transport instruction. In the present embodiment, the subordinate control device Cv controls some or all of the traveling motor Ml, the gripping motor M41, the lifting motor M42, the sliding motor M43, and the turning motor M44, and transports and transfers the article 8 associated with the transport instruction.

Figure 6:
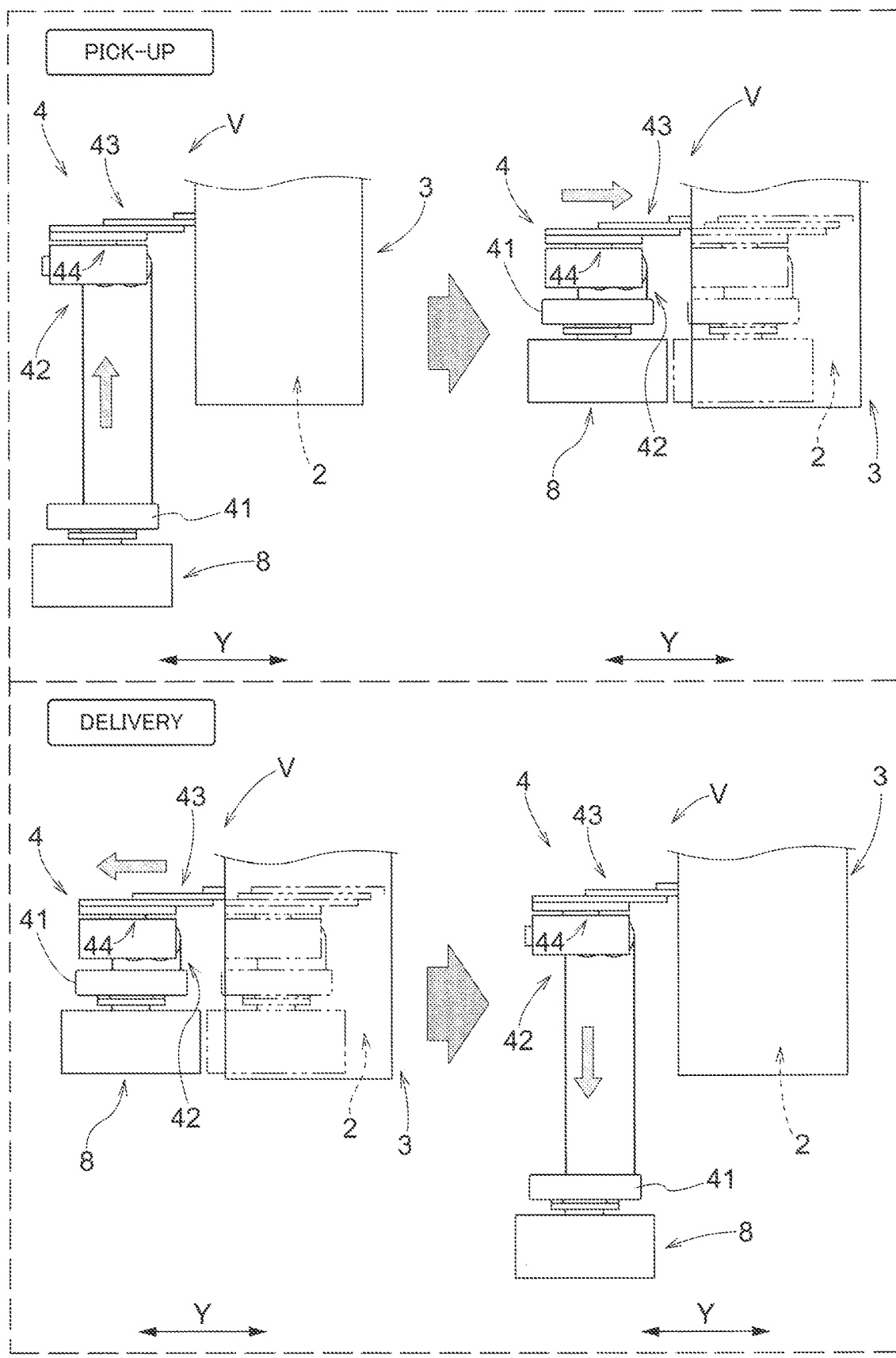
FIG. 6 is a diagram illustrating a pick-up operation and a delivery operation.

Here, "transfer of an article 8" includes "picking up of the article 8" and "delivering of the article 8", as shown in FIG. 6. That is to say, the transfer operation performed by the transfer mechanism 4 includes a pick-up operation of moving the article 8 from the transferring area 9 into the containing portion 2, and a delivery operation of moving the article 8 from inside the containing portion 2 to the transferring area 9 (see also FIG. 1).

The pick-up operation of picking up an article 8 is performed by the transfer mechanism 4 as follows. The article transport vehicle V travels along the moving path R in a state of not holding any article 8 with the holding portion 41, and stops at a position corresponding to the transferring area 9. An article 8 to be picked up by the article transport vehicle V is arranged in the transferring area 9 (specifically, the support platform 92 in the transferring area 9). The transfer mechanism 4 causes the sliding mechanism 43 to slide the holding portion 41 from inside to outside the containing portion 2 and arrange the holding portion 41 at a position directly above the article 8 in the transferring area 9 (support platform 92). Thereafter, the transfer mechanism 4 causes the lifting mechanism 42 to lower the holding portion 41 to the height of the article 8, and causes the holding portion 41 to hold the article 8. Then, the transfer mechanism 4 causes the lifting mechanism 42 to raise the holding portion 41 that is holding the article 8 to the height of the containing portion 2, as shown in the upper part of FIG. 6. Thereafter, the transfer mechanism 4 causes the sliding mechanism 43 to slide the holding portion 41 that is holding the article 8 from outside to inside the containing portion 2. The transfer mechanism 4 thus performs the pick-up operation of picking up the article 8.

On the other hand, the delivery operation of delivering an article 8 performed by the transfer mechanism 4 is performed as follows. The article transport vehicle V travels along the moving path R while holding the article 8 using the holding portion 41 within the containing portion 2, and stops at a position corresponding to the transferring area 9. Then, as shown in the lower part of FIG. 6, the transfer mechanism 4 causes the sliding mechanism 43 to slide the holding portion 41 that is holding the article 8 from inside to outside the containing portion 2, and arranges the holding portion 41 at a position directly above the transferring area 9 (specifically, the support platform 92 in the transferring area 9). The transfer mechanism 4 then causes the lifting mechanism 42 to lower the holding portion 41 that is holding the article 8 to the height of the transferring area 9 (support platform 92), and puts the article 8 on the transferring area 9 (support platform 92). The transfer mechanism 4 thus performs the delivery operation of delivering the article 8. Note that, after finishing the delivery operation of delivering the article 8, the subordinate control device Cv controls the lifting mechanism 42 and the sliding mechanism 43 so as to put the holding portion 41 in a state of not holding an article 8 into the containing portion 2.

The transfer mechanism 4 performs the pick-up operation and the delivery operation, each of which is a part of the transfer operation, as described above. As mentioned above, during the pick-up operation and the delivery operation, each mechanism that constitutes a portion of the transfer mechanism 4 operates in a state where the holding portion 41 is holding an article 8, or in a state where the holding portion 41 is not holding an article 8. In the following, a sliding operation performed by the sliding operation 43 in a state where the holding portion 41 is holding an article 8 is referred to as a "holding-sliding operation". That is to say, the "holding-sliding operation" means that the holding portion 41 in a state of holding an article 8, or an article 8 in a state of being held by the holding portion 41 is slid by the sliding mechanism 43. On the other hand, a sliding operation performed by the sliding mechanism 43 in a state where the holding portion 41 is not holding an article 8 is referred to as a "non-holding-sliding operation". These definitions are for distinguishing between the sliding operations performed by the sliding mechanism 43 in a state where the holding portion 41 is holding an article 8 and in a state where the holding portion 41 is not holding an article 8, for convenience of description.

Here, the turning mechanism 44 changes the orientation of an article 8 held by the holding portion 41 such that the article 8 faces in a direction appropriate with respect to the transferring area 9 by turning the article 8, as mentioned above. Such an orientation change is usually performed directly above the transferring area 9 (support platform 92) that is a transport destination. The orientation change is performed through a turning operation of the turning mechanism 44. By performing the turning operation in parallel with the above-described operations of the mechanisms, a plurality of operations are performed in the same period, and thus, the efficiency of the operations of the transfer mechanism 4 can be improved. When possible, the article transport vehicle V changes the orientation of an article 8 in parallel with the holding-sliding operation during the pick-up operation and the delivery operation.

However, it may not be preferable to change the orientation of an article 8 in parallel with the holding-sliding operation depending on the type of the article 8. A description will be given below.

A movement trajectory of a first-type article 81 when the first-type article 81 is slid by the sliding mechanism 43 without being turned by the turning mechanism 44 is referred to as a first sliding trajectory Ts1, and a movement trajectory of the first-type article 81 when the first-type article 81 is slid by the sliding mechanism 43 while being turned by the turning mechanism 44 is referred to as a first turning movement trajectory Tr1, as shown in FIG. 7. Each first-type article 81 is an article 8 whose first sliding trajectory Ts1 does not overlap with a target member O provided in the containing portion 2, and whose first turning movement trajectory Tr1 overlaps with the target member O. That is to say, if the first-type article 81 is slid by the sliding mechanism 43 without being turned by the turning mechanism 44, the first-type article 81 does not interfere with the target member O, as shown in FIG. 7(a). On the other hand, if the first-type article 81 is slid by the sliding mechanism 43 while being turned by the turning mechanism 44, there is a possibility that the first-type article 81 will interfere with the target member O, as shown in FIG. 7(b). Accordingly, as for the first-type article 81, it is not favorable to change the orientation of the article 8 during the holding-sliding operation since there is a possibility of interference between the first-type article 81 and the target member O.

Meanwhile, a movement trajectory of a second-type article 82 when the second-type article 82 is slid by the sliding mechanism 43 without being turned by the turning movement trajectory 44 is referred to as a second sliding trajectory Ts2, and a movement trajectory of the second-type article 82 when the second-type article 82 is slid by the sliding mechanism 43 while being turned by the turning mechanism 44 is referred to as a second turning movement trajectory Tr2, as shown in FIG. 8. Each second-type article 82 is an article 8 whose second sliding trajectory Ts2 and second turning movement trajectory Tr2 do not overlap with the target member O provided in the containing portion 2. That is to say, the second-type article 82 does not interfere with the target member O either when slid by the sliding mechanism 43 without being turned by the turning mechanism 44 or when slid by the sliding mechanism 43 while being turned by the turning mechanism 44, as shown in FIGS. 8(a) and 8(b). Accordingly, as for the second-type article 82, there is no or very little possibility of interference between the second-type article 82 and the target member O even if the orientation of the article 8 is changed during the holding-sliding operation. Therefore, a plurality of operations can be performed in the same period while avoiding interference between the article 8 and the target member O, and thus, the efficiency of the operations of the transfer mechanism 4 can be appropriately improved.

In the present embodiment, the target member O provided in the containing portion 2 is the load sensor 5. As mentioned above, the load sensor 5 is provided such that at least a portion thereof protrudes into the containing 2. The load sensor 5 is provided at a position that does not overlap with the first sliding trajectory Ts1 but overlaps with the first turning movement trajectory Tr1, as shown in FIG. 7. Meanwhile, the load sensor 5 is provided at a position that do not overlap either the second sliding trajectory Ts2 or the second turning movement trajectory Tr2, as shown in FIG. 8.

In the article transport vehicle V, the subordinate control device Cv is configured to determine the type of the article 8 held by the holding portion 41 and control the transfer mechanism 4 based on this determination. Specifically, the subordinate control device Cv determines whether the article 8 held by the holding portion 41 is the first-type article 81 or the second-type article 82, or another type of article 8, and controls the sliding mechanism 43 (sliding motor M43) and the turning mechanism 44 (turning motor M44) based on this determination.

If the subordinate control device Cv determines that the article 8 held by the holding portion 41 is the first-type article 81, the subordinate control device Cv controls the transfer mechanism 4 so as to cause the turning mechanism 44 to perform the turning operation and cause the sliding mechanism 43 to perform the sliding operation such that the operation periods of these operations do not overlap. In the present embodiment, if the subordinate control device Cv determines that the article 8 held by the holding portion 41 is the first-type article 81, the subordinate control device Cv controls the transfer mechanism 4 such that the turning operation is performed after the holding-sliding operation (sliding operation) is complete, or controls the transfer mechanism 4 such that the holding-sliding operation (sliding operation) is performed after the turning operation is complete.

Further, if the subordinate control device Cv determines that the article 8 held by the holding portion 41 is the second-type article 82, the subordinate control device Cv controls the transfer mechanism 4 so as to cause the turning mechanism 44 to perform the turning operation and cause the sliding mechanism 43 to perform the sliding operation such that the operation periods of these operations overlap. In the present embodiment, if the subordinate control device Cv determines that the article 8 held by the holding portion 41 is the second-type article 82, the subordinate control device Cv controls the transfer mechanism 4 such that the turning operation is performed during a period from when the holding-sliding operation (sliding operation) starts until this holding-sliding operation (sliding operation) is complete, or such that the holding-sliding operation (sliding operation) is performed during a period from when the turning operation starts until when this turning operation is complete. In this example, if the subordinate control device Cv determines that the article 8 held by the holding portion 41 is the second-type article 82, the subordinate control device Cv simultaneously drives the turning mechanism 44 and the sliding mechanism 43 (see FIG. 9).

In the present embodiment, the subordinate control device Cv is configured to acquire the result of the article type detection unit S detecting the type of the article 8, as shown in FIG. 5. The subordinate control device Cv determines whether the article 8 held by the holding portion 41 is the first-type article 81 or the second-type article 82, or another type of article 8, based on the result of detection by the article type detection unit S. That is to say, in the present embodiment, the subordinate control device Cv determines that the article 8 held by the holding portion 41 is the first-type article 81 if the type of the article 8 detected by the article type detection unit S is the first-type article 81, and the subordinate control device Cv determines that the article 8 held by the holding portion 41 is the second-type article 82 if the type of the article 8 detected by the article type detection unit S is the second-type article 82.

Here, in the present embodiment, the article type detection unit S is configured to detect the type of the article 8 in a state of being contained the containing portion 2 (namely a contained article 8), as mentioned above. That is to say, in this example, even if the article 8 is held by the holding portion 41, the type of the article cannot be detected by the article type detection unit S if the article 8 is outside the containing portion 2. The state where the article 8 held by the holding portion 41 is outside the containing portion 2 includes a state before the article 8 held by the holding portion 41 in the transferring area 9 (see FIG. 1) is put into the containing portion 2 during the pick-up operation performed by the transfer mechanism 4, as shown in the upper part of FIG. 6, for example. In this state, the type of the article 8 cannot be detected by the article type detection unit S. The type of the article can be detected by the article type detection unit S only after the pick-up operation is complete and the article 8 is put into the containing portion 2. That is to say, before the pick-up operation is complete, the subordinate control device Cv cannot obtain the result of detection by the article type detection unit S, and cannot ascertain whether the article 8 subjected to the pick-up operation is the first-type article 81 or the second-type article 82.

In the present embodiment, when the subordinate control device Cv causes the transfer mechanism 4 to perform the pick-up operation, the turning operation and the holding-sliding operation (sliding operation) are performed such that the operation periods do not overlap, without determining the type of the article 8 (detection result: none), as shown in FIG. 9. In this example, when the subordinate control device Cv causes the transfer mechanism 4 to perform the pick-up operation, the holding-sliding operation (sliding operation) is performed to arrange the article 8 in the containing portion 2, and thereafter the turning operation is performed with the article 8 arranged in the containing portion 2. Thus, even if an article 8 whose type has not yet been ascertained and that is to be subjected to the pick-up operation is the first-type article 81, the article 8 that is moving due to the holding-sliding operation (sliding operation) can be prevented from interfering with the target member O since the first sliding trajectory Ts1 does not overlap with the target member O, as shown in FIG. 7(a). Further, even if the article 8 subjected to the pick-up operation is the second-type article 82, the article 8 that is moving due to the holding-sliding operation (sliding operation) can be prevented from interfering with the target member O since the second sliding trajectory Ts2 does not overlap with the target member O, as shown in FIG. 8(a).

In contrast, before the transfer mechanism 4 performs the delivery operation, the article 8 subjected to the delivery operation is contained in the containing portion 2. Therefore, the type of this article 8 can be detected by the article type detection unit S, and the subordinate control device Cv can ascertain whether the article 8 subjected to the delivery operation is the first-type article 81 and the second-type article 82.

In the present embodiment, when the subordinate control device Cv causes the transfer mechanism 4 to perform the delivery operation, the subordinate control device Cv selects whether the turning operation and the sliding operation are to be performed such that the operation periods of these operations overlap or are to be performed such that the operation periods do not overlap, in accordance with the type of the article 8 detected by the article type detection unit S, as shown in FIG. 9.

In the present embodiment, when the subordinate control device Cv causes the transfer mechanism 4 to perform the delivery operation, if it is determined that the article 8 subjected to the delivery operation is the first-type article 81 (detection result: first-type article), the turning operation is performed with the article 8 arranged in the containing portion 2, and thereafter the holding-sliding operation (sliding operation) is performed to arrange the article 8 outside the containing portion 2. Thus, the article 8 that is moving due to the holding-sliding operation (sliding operation) can be prevented from interfering with the target member O since the first sliding trajectory Ts1 does not overlap with the target member O (FIG. 7(a)).

Further, in the present embodiment, when the subordinate control device Cv causes the transfer mechanism 4 to perform the delivery operation, if it is determined that the article 8 subjected to the delivery operation is the second-type article 82 (detection result: second-type article), the turning operation and the sliding operation are performed such that the operation periods of these operations overlap. In this example, the turning mechanism 44 and the sliding mechanism 43 are simultaneously driven. Since the second turning movement trajectory Tr2 does not overlap with the target member O (FIG. 8(b)), the article 8 that is moving due to the holding-sliding operation (sliding operation) can be prevented from interfering with the target member O, and the efficiency of the operations of the transfer mechanism 4 can be improved since the holding-sliding operation and the turning operation can be performed in the same period.

OTHER EMBODIMENTS

Next, other embodiments of the article transport vehicle will be described.

(1) The above embodiment has described an example in which the subordinate control device Cv determines whether or not the article 8 held by the holding portion 41 is the first-type article 81 or the second-type article 82, based on the result of detection by the article type detection unit S. However, the present invention is not limited to such an example. For example, a configuration may alternatively be employed in which the transport instruction acquired by the instruction acquisition unit 6 (see FIG. 5) includes article type information indicating the type of the article 8 associated with the transport instruction, and the subordinate control device Cv determines that the article 8 held by the holding portion 41 is the first-type article 81 if the type of the article 8 indicated by the article type information acquired by the instruction acquisition unit 6 is the first-type article 81 (information acquired: first-type article), and determines that the article 8 held by the holding portion 41 is the second-type article 82 if the type of the article 8 indicated by the article type information acquired by the instruction acquisition unit 6 is the second-type article 82 (information acquired: second-type article), as shown in FIG. 10. When the subordinate control device Cv causes the transfer mechanism 4 to perform the pick-up operation (see the upper part of FIG. 6), if the type of the article 8 indicated by the article type information acquired by the instruction acquisition unit 6 is the first-type article 81, the subordinate control device Cv controls the transfer mechanism 4 such that the turning operation is performed after the holding-sliding operation (sliding operation) is complete. On the other hand, when the subordinate control device Cv causes the transfer mechanism 4 to perform the delivery operation (see the lower part of FIG. 6), if the type of the article 8 indicated by the article type information acquired by the instruction acquisition unit 6 is the first-type article 81, the subordinate control device Cv controls the transfer mechanism 4 such that the holding-sliding operation (sliding operation) is performed after the turning operation is complete. If the type of the article 8 indicated by the article type information acquired by the instruction acquisition unit 6 is the second-type article 82, the subordinate control device Cv simultaneously drives the turning mechanism 44 and the sliding mechanism 43 regardless of whether to cause the transfer mechanism 4 to perform the pick-up operation or the delivery operation.

When the transport instruction acquired by the instruction acquisition unit 6 (see FIG. 5) includes the article type information indicating the type of the article 8 associated with the transport instruction as mentioned above, the subordinate control device Cv may also determine whether the article 8 held by the holding portion 41 is the first-type article 81 or the second-type article 82 based on both the article type information acquired by the instruction acquisition unit 6 and the result of detection by the article type detection unit S. In this case, however, the type of the article 8 is determined also based on the result of detection by the article type detection unit S, but when the pick-up operation is performed, the result of detection by the article type detection unit S cannot be obtained before the pick-up operation, as mentioned above. Accordingly, it is preferable to determine the type of the article 8 based on both the article type information acquired by the instruction acquisition unit 6 and the result of detection by the article type detection unit S when the delivery operation is performed. For example, the subordinate control device Cv determines that the article 8 held by the holding portion 41 is the first-type article 81 if the type of the article 8 indicated by the article type information acquired by the instruction acquisition unit 6 is the first-type article 81 (information acquired: first-type article) and the type of the article 8 detected by the article type detection unit S is the first-type article 81 (detection result: first-type article), as shown in FIG. 11. In this case, the subordinate control device Cv controls the transfer mechanism 4 such that the holding-sliding operation (sliding operation) is performed after the turning operation is complete. Further, the subordinate control device Cv determines that the article 8 held by the holding portion 41 is the second-type article 82 if the type of the article 8 indicated by the article type information acquired by the instruction acquisition unit 6 is the second-type article 82 (information acquired: second-type article) and the type of the article 8 detected by the article type detection unit S is the second-type article (detection result: second-type article). In this case, the subordinate control device Cv simultaneously drives the turning mechanism 44 and the sliding mechanism 43. If the type of the article 8 indicated by the article type information acquired by the instruction acquisition unit 6 does not match the type of the article 8 detected by the article type detection unit S, the subordinate control device Cv controls the transfer mechanism 4 so as to perform the turning operation and the sliding operation such that the operation periods of these operations do not overlap. That is to say, the subordinate control device Cv controls the transfer mechanism 4 such that the holding-sliding operation (sliding operation) is performed after the turning operation is complete if the detection result indicates the first-type article and the information acquired indicates the second-type article, and if the detection result indicates the second-type article and the information acquired indicates the first-type article, as shown in FIG. 11.

(2) The above embodiment has described an example in which the article type detection unit S is configured to detect the type of the article 8 in a state of being contained in the containing portion 2 (namely, contained article 8). However, the present invention is not limited to such an example, and the article type detection unit S may alternatively be configured to detect the type of the article 8 that is in a state of being held by the holding portion 41 and is present outside the containing portion 2. In this case, the article type detection unit S may be configured to detect the type of the article 8 held by the holding portion 41 by detecting the state of the holding portion 41 holding the article 8. For example, the article type detection unit S may be configured as a weight sensor to detect the weight of the article 8 in a state of being held by the holding portion 41. In this case, the article type detection unit S can detect the type of the article 8 held by the holding portion 41 based on the weight, which differs depending of the type of the article 8. Further, the present invention is not limited to such an example, and a configuration may be employed in which, for example, the shape or the like of the held portion 8g to be held by the holding portion 41 differs depending on the type of the article 8, and the article type detection unit S detects the shape or the like of the held portion 8g that differs depending on the type of the article 8, and the type of the article 8 held by the holding portion 41 is detected based on the result of detecting the shape or the like of the held portion 8g.

(3) The above embodiment has described an example in which the article transport vehicle V includes the load sensor 5 for detecting whether or not an article 8 contained in the containing portion 2 is present, and the article type detection unit S for detecting the type of the article 8 held by the holding portion 41. That is to say, in the above-described example, the load sensor 5 and the article type detection unit S are provided separately. However, the present invention is not limited to such an example, and the load sensor 5 and the article type detection unit S may be constituted by one sensor. That is to say, the article type detection unit S may also serve as the load sensor 5, and vice versa.

(4) The above embodiment has described an example in which the target member O that is a member that may interfere with the article 8 is the load sensor 5. However, the present invention is not limited to such an example, and for example, various members and portions, such as the article type detection unit S, a drop restriction member (not shown) for restricting dropping of an article 8 during transportation, and a portion of the cover 3, may be the target member O.

(5) Note that the configuration disclosed in the above embodiment can also be applied in combination with configurations disclosed in other embodiments as long as no contradiction arises. Regarding other configurations as well, the embodiment disclosed in the present specification is merely an example in all respects. Accordingly, various modifications can be made as appropriate without departing from the gist of the present disclosure.

Summary of the Above Embodiment

The above-described article transport vehicle will be described below.

An article transport vehicle that moves along a moving path and transports a plurality of types of articles, assuming that a direction in which the article is transported along the moving path is a transport direction, and a direction intersecting the transport direction when viewed in a vertical direction is an intersecting direction, the article transport vehicle includes:

a containing portion configured to contain an article, of the plurality of types of articles;

a transfer mechanism configured to perform a transfer operation of transferring the article to and from a transferring area located outside the containing portion; and a control device configured to control the transfer mechanism, wherein, the transfer mechanism includes: a holding portion configured to hold the article; a lifting mechanism configured to raise and lower the holding portion; a sliding mechanism configured to slide the holding portion along the intersecting direction between inside and outside the containing portion; and a turning mechanism configured to turn the holding portion about a vertical axis, the plurality of types of articles include at least two types, namely, a first-type article and a second-type article, assuming that a movement trajectory of the first-type article when slid by the sliding mechanism without being turned by the turning mechanism is a first sliding trajectory, a movement trajectory of the first-type article when slid by the sliding mechanism while being turned by the turning mechanism is a first turning movement trajectory, a movement trajectory of the second-type article when slid by the sliding mechanism without being turned by the turning mechanism is a second sliding trajectory, and a movement trajectory of the second-type article when slid by the sliding mechanism while being turned by the turning mechanism is a second turning movement trajectory, the first-type article is an article whose first sliding trajectory does not overlap with a target member provided in the containing portion, and whose first turning movement trajectory overlaps with the target member, and the second-type article is an article whose second sliding trajectory and second turning movement trajectory do not overlap with the target member provided in the containing portion, and the control device controls the transfer mechanism so as to cause the turning mechanism to perform a turning operation and cause the sliding mechanism to perform a sliding operation such that an operation period of the turning operation and an operation period of the sliding operation do not overlap, if the control device determines that the article held by the holding portion is the first-type article, and controls the transfer mechanism so as to perform the turning operation and the sliding operation such that the operation period of the turning operation and the operation period of the sliding operation overlap, if the control device determines that the article held by the holding portion is the second-type article.

According to this configuration, the first turning movement trajectory of the first-type article overlaps with the target member provided in the containing portion. For this reason, if the turning operation and the sliding operation are performed such that the operation periods of these operations overlap when the article held by the holding portion is the first-type article, there is a possibility that the first-type article will interfere with the target member. However, according to this configuration, if the control device determines that the article held by the holding portion is the first-type article, the control device controls the transfer mechanism so as to perform the turning operation and the sliding operation such that the operation periods of these operations do not overlap. Since the first sliding trajectory of the first-type article does not overlap with the target member, the sliding operation can be performed without causing the first-type article to interfere with the target member, and the first-type article can also be turned at a position at which the first-type article does not interfere with the target member. As a result, interference between the first-type article and the target member can be avoided. Meanwhile, the second turning movement trajectory of the second-type article does not overlap with the target member provided in the containing portion. According to this configuration, if the article held by the holding portion is the second-type article, the turning operation and the sliding operation are performed such that the operation periods of these operations overlap. Thus, the sliding operation and the turning operation can be performed in parallel, and it is therefore possible to shorten the time required for the operation of changing the orientation of the article and improve the efficiency of the operations.

Further, according to this configuration, it is possible to design the size of the article transport vehicle, particularly the size of the space around the containing portion, so as to match the second-type article whose turning radius is smaller than that of the first-type article. Accordingly, there is also an advantage that the size of the article transport vehicle can be easily reduced compared with the case of designing the article transport vehicle and the containing portion thereof so as to match the first-type article.

As described above, according to this configuration, in an article transport vehicle that is able to transport a plurality of types of articles, the efficiency of the operations can be improved in accordance with the type of article, while suppressing the increase in the size of the article transport vehicle.

Here, it is preferable that the article transport vehicle further includes an article type detection unit configured to detect a type of the article held by the holding portion, wherein the control device determines that the article held by the holding portion is the first-type article if the type of the article detected by the article type detection unit is the first-type article, and determines that the article held by the holding portion is the second-type article if the type of the article detected by the article type detection unit is the second-type article.

According to this configuration, whether the article held by the holding portion is the first-type article or the second-type article can be determined based on the result of detection by the article type detection unit. Therefore, the type of the article can be appropriately determined based on the result of directly detecting the article that is actually held by the holding portion.

It is preferable that the article transport vehicle further includes an instruction acquisition unit configured to acquire, from a superordinate control device, a transport instruction to transport the article, wherein the transport instruction acquired by the instruction acquisition unit includes article type information indicating a type of the article associated with the transport instruction, and the control device determines that the article held by the holding portion is the first-type article if the type of the article indicated by the article type information acquired by the instruction acquisition unit is the first-type article, and determines that the article held by the holding portion is the second-type article if the type of the article indicated by the article type information acquired by the instruction acquisition unit is the second-type article.

According to this configuration, whether the article held by the holding portion is the first-type article or the second-type article can be determined based on the article type information included in the transport instruction transmitted from the superordinate control device. Therefore, the type of the article can be appropriately determined without providing the article transport vehicle with a sensor or the like for detecting the type of the article.

It is preferable that the article transport vehicle further includes an instruction acquisition unit configured to acquire, from a superordinate control device, a transport instruction to transport the article, wherein the transport instruction acquired by the instruction acquisition unit includes article type information indicating the type of the article associated with the transport instruction, and the control device determines that the article held by the holding portion is the first-type article if the type of the article indicated by the article type information acquired by the instruction acquisition unit is the first-type article, and the type of the article detected by the article type detection unit is the first-type article, determines that the article held by the holding portion is the second-type article if the type of the article indicated by the article type information acquired by the instruction acquisition unit is the second-type article, and the type of the article detected by the article type detection unit is the second-type article, and controls the transfer mechanism so as to perform the turning operation and the sliding operation such that the operation period of the turning operation and the operation period of the sliding operation do not overlap, if the type of the article indicated by the article type information acquired by the instruction acquisition unit does not match the type of the article detected by the article type detection unit.

According to this configuration, whether the article held by the holding portion is the first-type article or the second-type article can be determined while giving consideration to both the result of detection by the article type detection unit and the article type information included in the transport instruction transmitted from the superordinate control device. Further, according to this configuration, the turning operation and the sliding operation are performed such that the operation periods of these operations do not overlap if the type of the article indicated by the article type information does not match the type of the article detected by the article type detection unit, and it is therefore possible to appropriately avoid interference between the article and the target member.

It is preferable that the transfer operation performed by the transfer mechanism includes a pick-up operation of moving the article from the transferring area into the containing portion, and a delivery operation, and a delivery operation of moving the article from inside the containing portion to the transferring area, the article type detection unit is configured to detect the type of the article in a state of being contained in the containing portion, and the control device causes the turning operation and the sliding operation to be performed such that the operation period of the turning operation and the operation period of the sliding operation do not overlap, without determining the type of the article, when causing the transfer mechanism to perform the pick-up operation, and selects whether to cause the turning operation and the sliding operation to be performed such that the operation period of the turning operation and the operation period of the sliding operation overlap or do not overlap, in accordance with the type of the article detected by the article type detection unit, when causing the transfer mechanism to perform the delivery operation.

According to this configuration, the article type detection unit is configured to detect the type of the article in a state of being contained in the containing portion. For this reason, before the pick-up operation is performed, the result of detection by the article type detection unit cannot be obtained, and whether the article subjected to the pick-up operation is the first-type article or the second-type article cannot be ascertained. Therefore, when the control device causes the transfer mechanism to perform the pick-up operation, the control device causes the turning operation and the sliding operation to be performed such that the operation periods of these operations do not overlap, without determining the type of the article. As a result, according to this configuration, interference between the article and the target member can be appropriately avoided.

INDUSTRIAL APPLICABILITY

The technology according to the present disclosure can be used in an article transport vehicle that moves along a moving path and transports a plurality of types of articles.

DESCRIPTION OF REFERENCE SIGNS

V: Article transport vehicle
2: Containing portion
4: Transfer mechanism
41: Holding portion
42: Lifting mechanism
43: Sliding mechanism
44: Turning mechanism
5: Load sensor
6: Instruction acquisition unit
8: Article
81: First-type article
82: Second-type article
9: Transferring area
Cv: Subordinate control device (control device)
Ct: Superordinate control device
O: Target member
S: Article type detection unit
Tr1: First turning movement trajectory
Tr2: Second turning movement trajectory
Ts1: First sliding trajectory
Ts2: Second sliding trajectory R: Moving path
X: Transport direction
y: Intersecting direction

What is claimed is:

1. An article transport vehicle that moves along a moving path and transports a plurality of types of articles, the article transport vehicle comprising:
   a containing portion configured to contain an article of the plurality of types of articles;
   a transfer mechanism configured to perform a transfer operation of transferring the article to and from a transferring area located outside the containing portion; and
   a control device configured to control the transfer mechanism;
   wherein:
   a direction in which the article is transported along the moving path is a transport direction, and a direction intersecting the transport direction when viewed in a vertical direction is an intersecting direction;
   the transfer mechanism comprises:
      a holding portion configured to hold the article;
      a lifting mechanism configured to raise and lower the holding portion;
      a sliding mechanism configured to slide the holding portion along the intersecting direction between inside and outside the containing portion; and
      a turning mechanism configured to turn the holding portion about a vertical axis;
   the plurality of types of articles comprise at least two types, including a first-type article and a second-type article;
   a movement trajectory of the first-type article when slid by the sliding mechanism without being turned by the turning mechanism is a first sliding trajectory, a movement trajectory of the first-type article when slid by the sliding mechanism while being turned by the turning mechanism is a first turning movement trajectory, a movement trajectory of the second-type article when slid by the sliding mechanism without being turned by the turning mechanism is a second sliding trajectory, and a movement trajectory of the second-type article when slid by the sliding mechanism while being turned by the turning mechanism is a second turning movement trajectory;
   the first-type article is an article whose first sliding trajectory does not overlap with a target member provided in the containing portion and whose first turning movement trajectory overlaps with the target member, and the second-type article is an article whose second sliding trajectory and second turning movement trajectory do not overlap with the target member provided in the containing portion;
   the control device:
      controls the transfer mechanism so as to cause the turning mechanism to perform a turning operation and cause the sliding mechanism to perform a sliding operation such that an operation period of the turning operation and an operation period of the sliding operation do not overlap, if the control device determines that the article held by the holding portion is the first-type article; and
      controls the transfer mechanism so as to perform the turning operation and the sliding operation such that the operation period of the turning operation and the operation period of the sliding operation overlap, if the control device determines that the article held by the holding portion is the second-type article; and
   the containing portion is configured to contain the second-type article so that the turning operation of the second-type article may occur entirely within the containing portion.

2. The article transport vehicle according to claim 1, further comprising:
   an article type detection unit configured to detect a type of the article held by the holding portion; and
   wherein the control device:
      determines that the article held by the holding portion is the first-type article if the type of the article detected by the article type detection unit is the first-type article; and
      determines that the article held by the holding portion is the second-type article if the type of the article detected by the article type detection unit is the second-type article.

3. The article transport vehicle according to claim 2, further comprising:
   an instruction acquisition unit configured to acquire, from a superordinate control device, a transport instruction to transport the article,
   wherein the transport instruction acquired by the instruction acquisition unit includes article type information indicating the type of the article associated with the transport instruction, and
   wherein the control device:
      determines that the article held by the holding portion is the first-type article if the type of the article indicated by the article type information acquired by the instruction acquisition unit is the first-type article, and the type of the article detected by the article type detection unit is the first-type article;
      determines that the article held by the holding portion is the second-type article if the type of the article indicated by the article type information acquired by the instruction acquisition unit is the second-type article, and the type of the article detected by the article type detection unit is the second-type article; and
      controls the transfer mechanism so as to perform the turning operation and the sliding operation such that the operation period of the turning operation and the operation period of the sliding operation do not overlap, if the type of the article indicated by the article type information acquired by the instruction acquisition unit does not match the type of the article detected by the article type detection unit.

4. The article transport vehicle according to claim 2,
   wherein the transfer operation performed by the transfer mechanism includes a pick-up operation of moving the article from the transferring area into the containing portion, and a delivery operation of moving the article from inside the containing portion to the transferring area;
   wherein the article type detection unit is configured to detect the type of the article contained in the containing portion; and
   wherein the control device:
      causes the turning operation and the sliding operation to be performed such that the operation period of the turning operation and the operation period of the sliding operation do not overlap, without determining the type of the article, when causing the transfer mechanism to perform the pick-up operation; and selects whether to cause the turning operation and the sliding operation to be performed such that the operation period of the turning operation and the operation period of the sliding operation overlap or do not overlap, in accordance with the type of the article detected by the article type detection unit, when causing the transfer mechanism to perform the delivery operation.

5. The article transport vehicle according to claim 1, further comprising:
an instruction acquisition unit configured to acquire, from a superordinate control device, a transport instruction to transport the article;
wherein the transport instruction acquired by the instruction acquisition unit includes article type information indicating a type of the article associated with the transport instruction; and
wherein the control device:
determines that the article held by the holding portion is the first-type article if the type of the article indicated by the article type information acquired by the instruction acquisition unit is the first-type article; and
determines that the article held by the holding portion is the second-type article if the type of the article indicated by the article type information acquired by the instruction acquisition unit is the second-type article.

6. An article transport vehicle that moves along a moving path and transports a plurality of types of articles, the article transport vehicle comprising:
a containing portion configured to contain an article of the plurality of types of articles;
a transfer mechanism configured to perform a transfer operation of transferring the article to and from a transferring area located outside the containing portion; and
a control device configured to control the transfer mechanism;
wherein:
a direction in which the article is transported along the moving path is a transport direction, and a direction intersecting the transport direction when viewed in a vertical direction is an intersecting direction;
the transfer mechanism comprises:
a holding portion configured to hold the article;
a lifting mechanism configured to raise and lower the holding portion;
a sliding mechanism configured to slide the holding portion along the intersecting direction between inside and outside the containing portion; and
a turning mechanism configured to turn the holding portion about a vertical axis;
the plurality of types of articles comprise at least two types, including a first-type article and a second-type article;
a movement trajectory of the first-type article when slid by the sliding mechanism without being turned by the turning mechanism is a first sliding trajectory, a movement trajectory of the first-type article when slid by the sliding mechanism while being turned by the turning mechanism is a first turning movement trajectory, a movement trajectory of the second-type article when slid by the sliding mechanism without being turned by the turning mechanism is a second sliding trajectory, and a movement trajectory of the second-type article when slid by the sliding mechanism while being turned by the turning mechanism is a second turning movement trajectory;
the first-type article is an article whose first sliding trajectory does not overlap with a target member provided in the containing portion and whose first turning movement trajectory overlaps with the target member, and the second-type article is an article whose second sliding trajectory and second turning movement trajectory do not overlap with the target member provided in the containing portion;
the control device:
controls the transfer mechanism so as to cause the turning mechanism to perform a turning operation and cause the sliding mechanism to perform a sliding operation such that an operation period of the turning operation and an operation period of the sliding operation do not overlap, if the control device determines that the article held by the holding portion is the first-type article;
controls the transfer mechanism so as to perform the turning operation and the sliding operation such that the operation period of the turning operation and the operation period of the sliding operation overlap, if the control device determines that the article held by the holding portion is the second-type article; and
the turning operation of the second-type article starts while a turning center of the second-type article is located inside the containing portion when viewed in the vertical direction when the second-type article is inserted into the containing portion.

* * * * *